United States Patent
Lohman

(10) Patent No.: US 7,158,388 B2
(45) Date of Patent: Jan. 2, 2007

(54) HOUSING FOR ELECTRONIC CIRCUITS, ELECTRICALLY CONNECTING ELEMENT AND CONTACT SPRING, PROCEDURE FOR ELECTROMAGNETIC SHIELDING

(75) Inventor: Bertil Lohman, Sollentuna (SE)

(73) Assignee: Bertil Lohman Design AB, Sollentunar (SE)

( * ) Notice: Subject to any disclaimer, the term of this patent is extended or adjusted under 35 U.S.C. 154(b) by 0 days.

(21) Appl. No.: 10/481,589

(22) PCT Filed: Jun. 27, 2002

(86) PCT No.: PCT/SE02/01292

§ 371 (c)(1),
(2), (4) Date: Apr. 21, 2004

(87) PCT Pub. No.: WO03/003802

PCT Pub. Date: Jan. 9, 2003

(65) Prior Publication Data

US 2004/0196627 A1    Oct. 7, 2004

(30) Foreign Application Priority Data

Jun. 27, 2001   (SE) .................................... 0102322

(51) Int. Cl.
*H05K 9/00* (2006.01)
(52) U.S. Cl. .................. 361/818; 361/816; 361/800; 174/35 R; 174/51
(58) Field of Classification Search ............... 361/769, 361/797, 788, 800, 816, 818, 752, 790; 174/35 R, 174/51
See application file for complete search history.

(56) References Cited

U.S. PATENT DOCUMENTS

| 5,250,751 | A  | * | 10/1993 | Yamaguchi ............ 174/35 GC |
|-----------|----|---|---------|---------------------------------|
| 5,929,376 | A  |   | 7/1999  | Doun et al.                     |
| 5,957,465 | A  | * | 9/1999  | Gonsalves et al. .......... 277/637 |
| 6,332,618 | B1 | * | 12/2001 | Karlsson ...................... 277/648 |
| 6,403,879 | B1 | * | 6/2002  | Clements et al. ........... 174/358 |
| 6,414,851 | B1 |   | 7/2002  | Cherniski et al.                |
| 6,618,271 | B1 | * | 9/2003  | Erickson et al. ............ 361/818 |

FOREIGN PATENT DOCUMENTS

| DE | 3907412 | 9/1990 |
|----|---------|--------|
| WO | 9320676 | 10/1993 |
| WO | 0237920 | 5/2002 |

* cited by examiner

*Primary Examiner*—Elvin Enad
*Assistant Examiner*—Hung S. Bui
(74) *Attorney, Agent, or Firm*—Nixon & Vanderhye P.C.

(57) ABSTRACT

At the opening (3) for insertable electronic or similar cards in a housing (1) for electronic circuits a frame is mounted including separate frame parts (5, 5', 5") having outer portions connecting to the edges of the opening. The frame can by its modular construction be adapted to an arbitrary number of shielding or cover plates (7) that are comprised in such cards and are placed or are to be placed in the opening. A simple mark-up of the position for a card can be easily made on a frame part located at the part opening for the card. The frame parts form together with the cover plates a whole continuous surface. Intermediate frame parts (5) divide the opening in part openings, each intended for only one cover plate. Elastic contact elements (27) are provided mounted in recesses in the frame parts to electrically connect adjacent cover plates to each other and a frame part to that cover plate or those cover plates which are located at the frame part. The contact elements provide a reliable elastic contact to edge surfaces of the cover plates by acting in the plane of the cover plates. Furthermore, contact springs (45, 45') connect the frame parts to the housing.

50 Claims, 9 Drawing Sheets

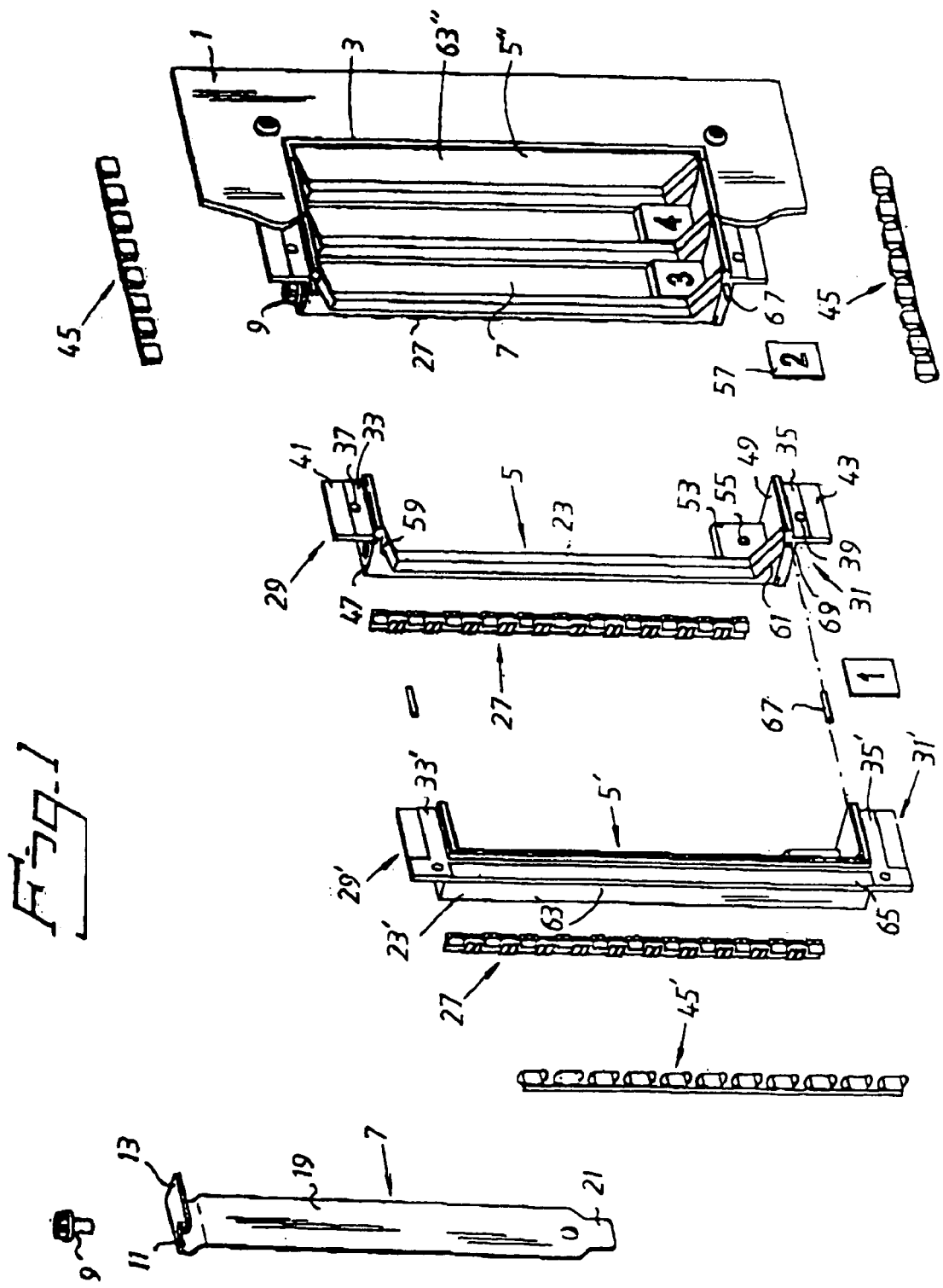

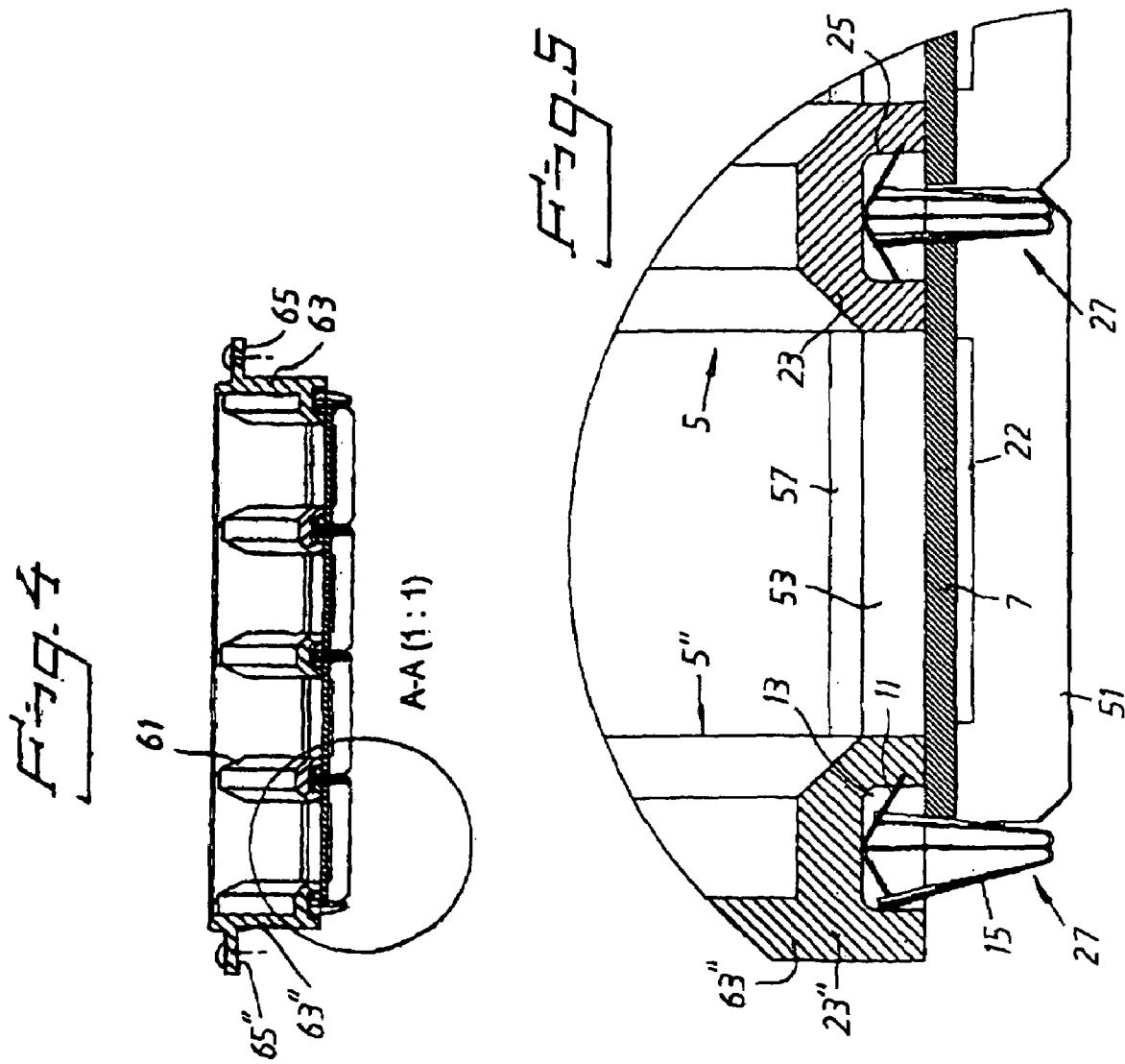

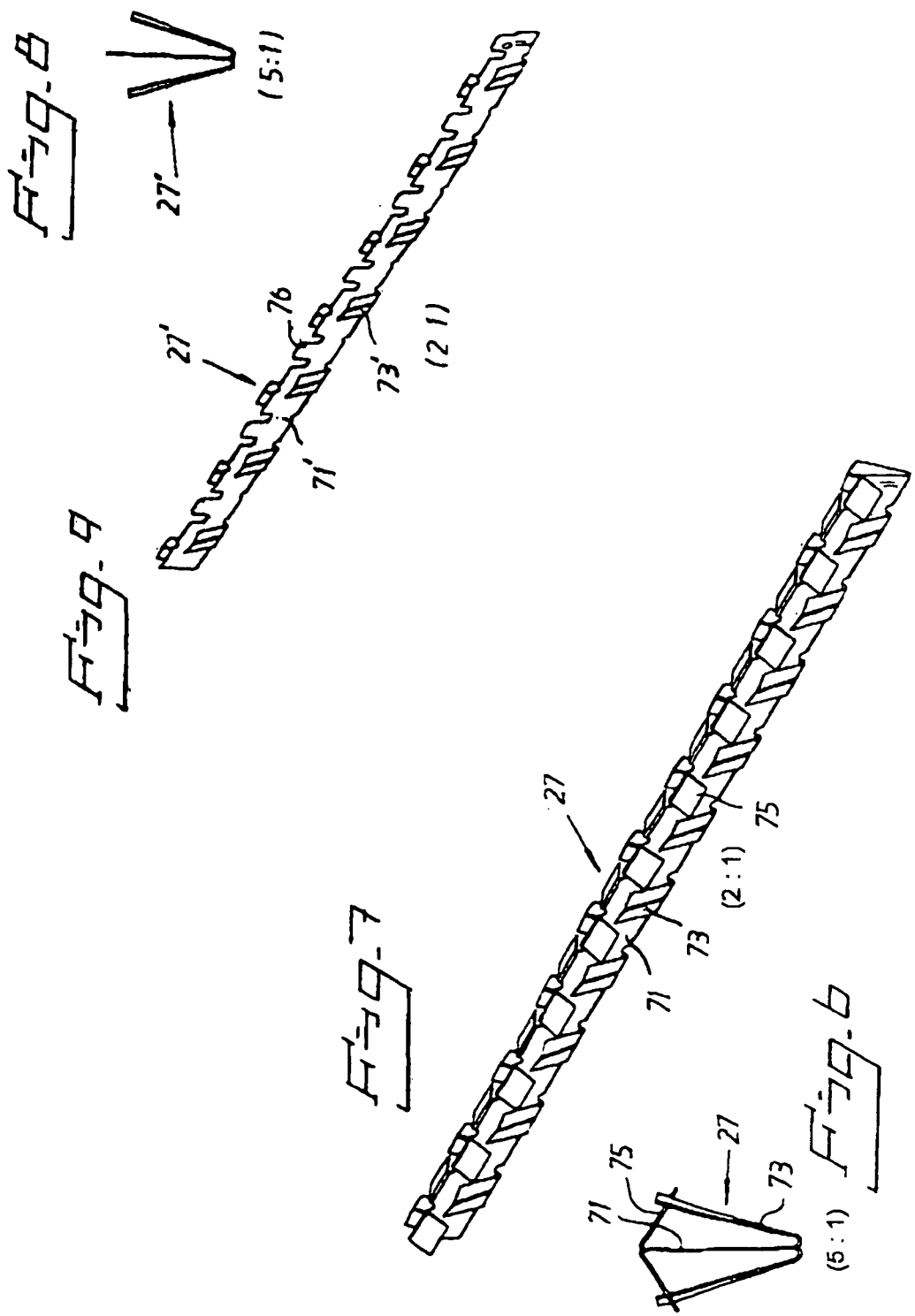

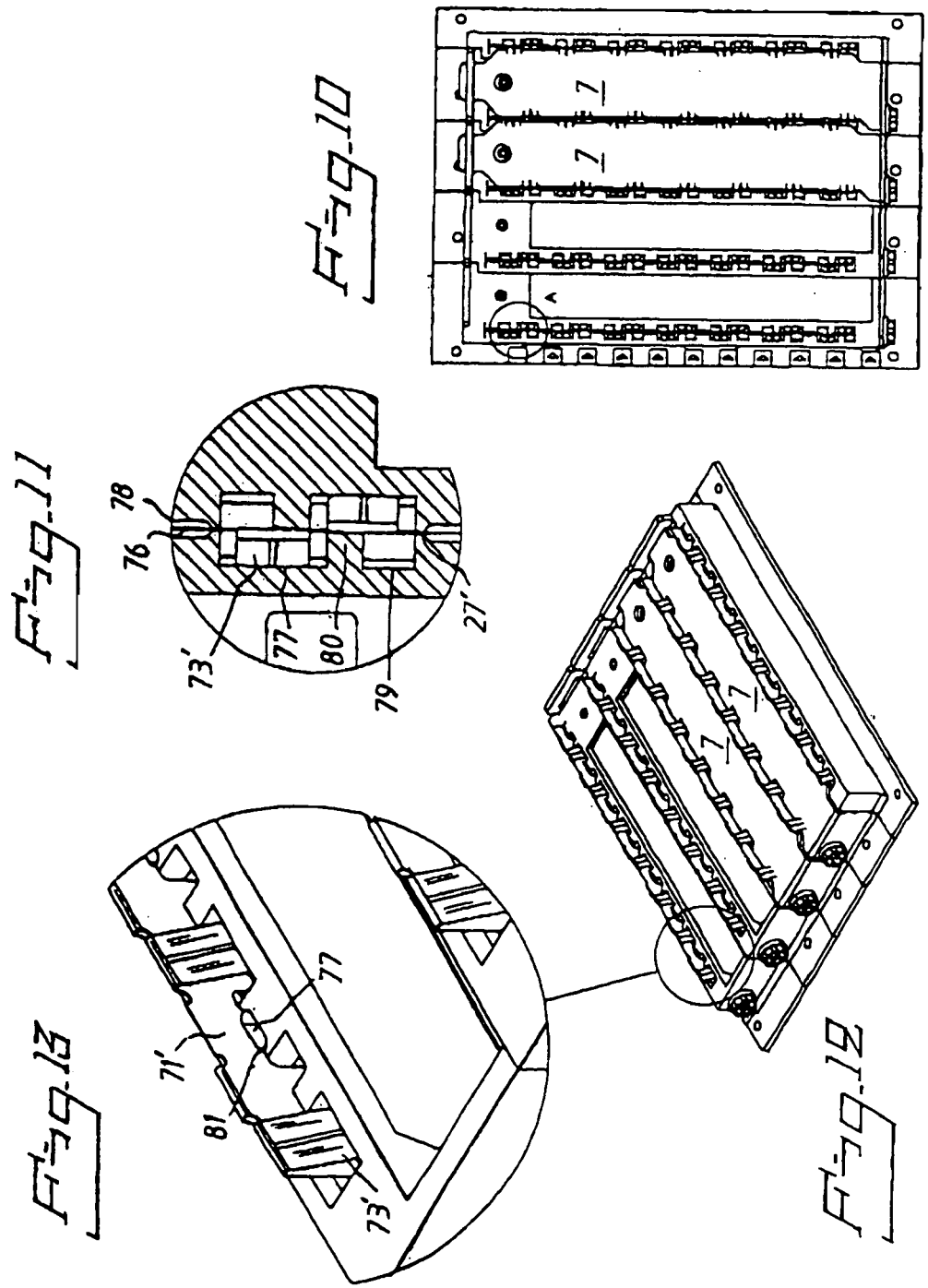

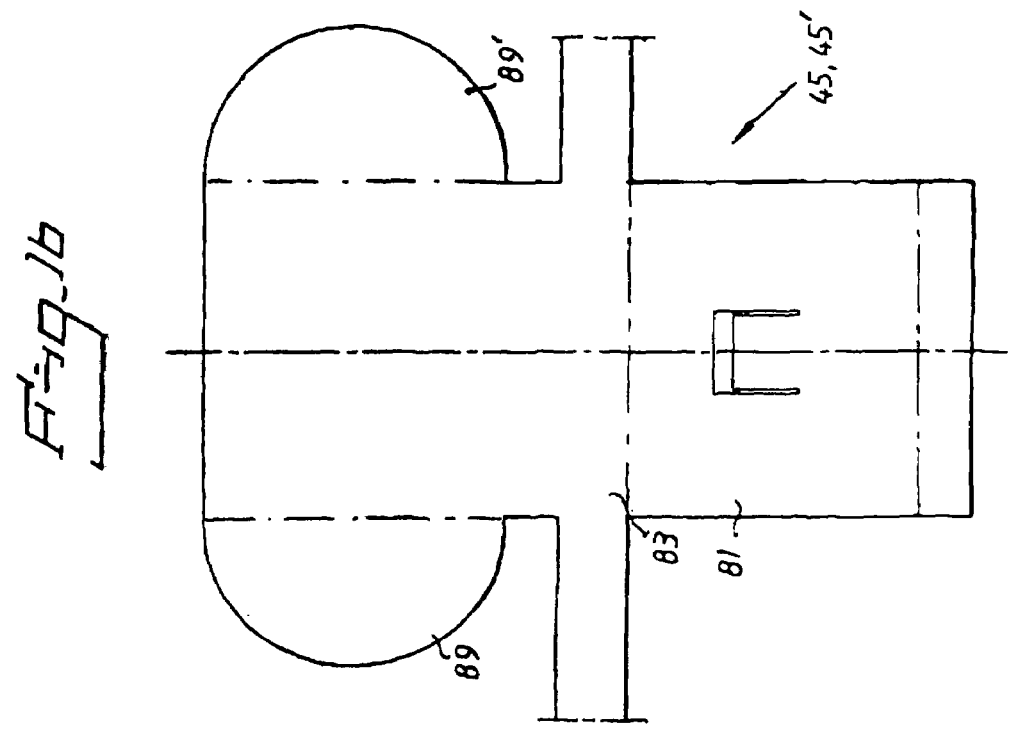
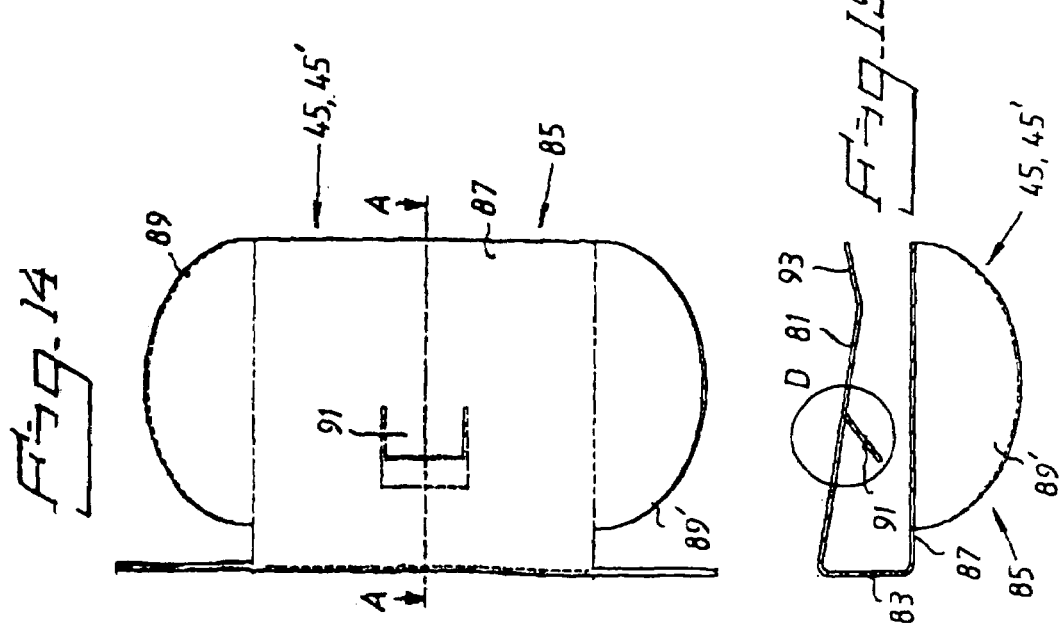

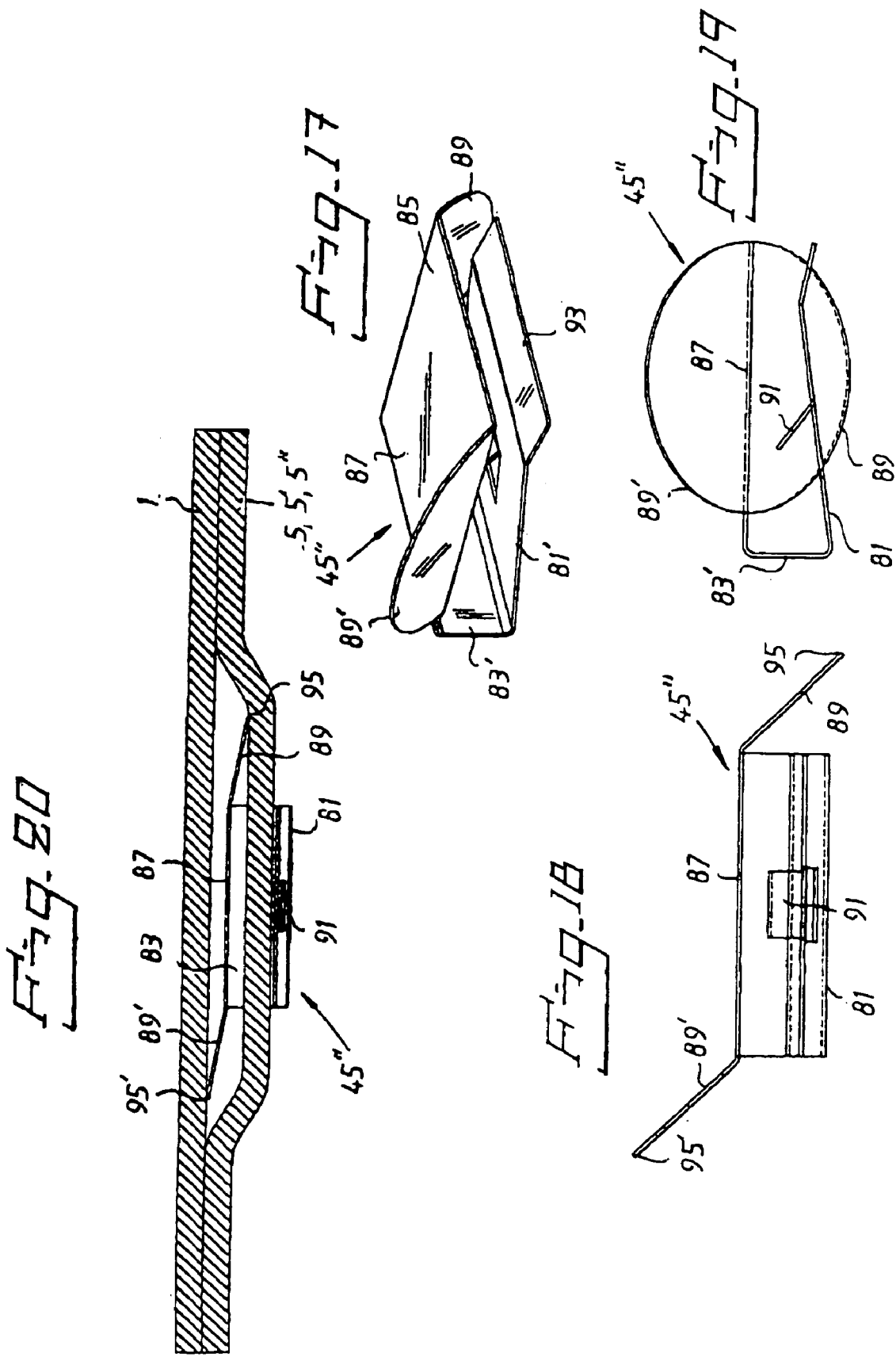

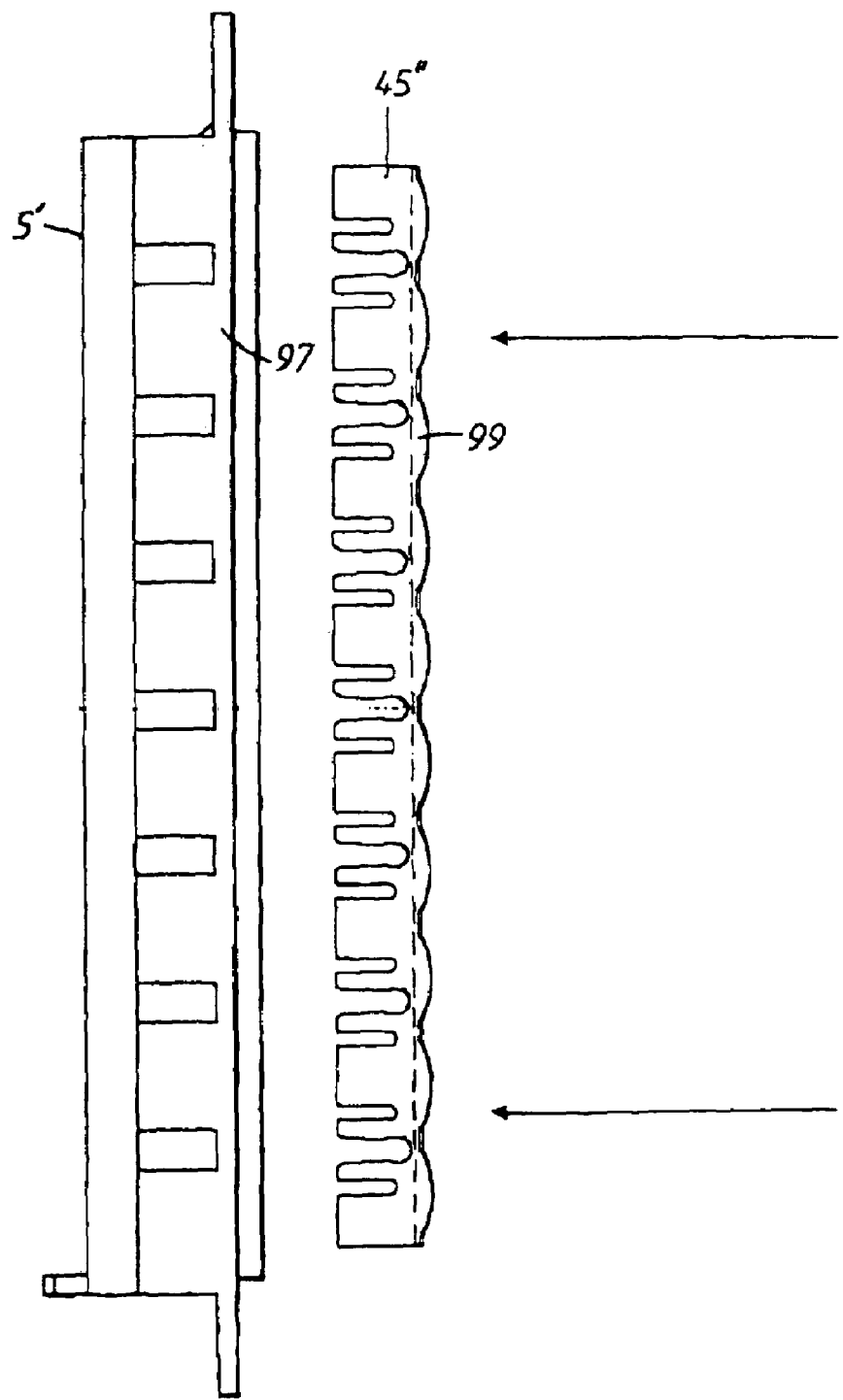

HOUSING FOR ELECTRONIC CIRCUITS, ELECTRICALLY CONNECTING ELEMENT AND CONTACT SPRING, PROCEDURE FOR ELECTROMAGNETIC SHIELDING

TECHNICAL FIELD

The invention relates to an apparatus housing or an apparatus casing such as an apparatus box for electronic circuits including electrically shielded openings for external connection of expansion boards or insertable boards and devices for providing this electric shielding, in particular a method and a device for electrical contacting of back plates of insertable boards and a system for budding frames for such back plates.

BACKGROUND OF THE INVENTION

Generally, personal computers are intended to be provided with accessories such as i.a. insertable boards or expansion boards for different functions such as typically for connection of a displaying monitor, i.e. to provide graphical displaying, for communication for instance through a modem or with a local network, for driving loudspeakers. The insertable boards are inserted in specially formed slot-shaped connectors that are generally directly mounted to the motherboard of the personal computer. The short side of an insertable board can carry connectors for a communication with the exterior and these connectors are then attached to a narrow back plate or shielding or covering plate of metal, that is mounted in an opening in the housing of the computer. The back plate has a bent top part that can be screwed to a frame at the opening and it is more narrow at its lower part where it can be inserted in a slot in the frame. For slot connectors in which no expansion board has been mounted simple back plates made of sheet metal are used, "dummy cover plates" or "idling cover plates", having no connectors and having no electric connections. In the case where there are high requirements on the electrical shielding of the circuits of the computer these back plates must well cover the opening in the computer box and furthermore, they must be in a good electrical contact with the material of the box. The latter condition is also true for the frame at the opening in which the back plates are attached.

In U.S. Pat. No. 5,929,376 a pressed plate 12 mounted in an instrument casing 10 is disclosed. The plate has in turn openings for expansion boards provided with back plates. Furthermore, springs 54, 54' are provided to connect an inserted back plate to the shaped plate 12. The springs have contact tongues acting against a large surface of the back plates belonging to inserted boards. This has a disadvantage by the fact that a lower pressing force and thereby a worse electrical contact can be obtained at the center of the back plate, see col. 3, lines 11–16. Therefore, reinforcement rods 72 for the springs are provided.

In German published Patent Application No. 39 07 412 a housing is disclosed consisting of a socket 1 for mounting it to a wall of a room and a plurality of identical frame part that are attached to the socket and at the sides of each other and that themselves form the housing. The space formed in each frame part can be closed by front and rear caps 30, 28. The spaces are not intended for expansion boards having back plates. The disclosed housing is a modularly conducted housing intended to accommodate simple boards for internal connections.

In the published International Patent Application No. WO 93/20676 a contact spring for shielding between housing elements of electronic equipment is disclosed. The spring has two legs that have different lengths and are connected by a cylindrical portion and they are bent towards each other so that a profile approximately as the FIG. 9 is obtained. The shorter leg has outermost a portion which is bent in an angle and is intended to enter an opening in a housing flange to maintain the spring in place. The bent portion of the spring is furthermore intended to come in mechanical and electric contact with an adjacent housing flange and then acts with a pressing force against the large surface of this flange.

Apparatus housings having openings for expansion boards are also disclosed in U.S. Pat. Nos. 5,579,210, 5,679,993, 5,820,171, 4,873,395, 5,004,867, 4,924,355 and the published European Patent Application No. 0 723 389. Contact springs for electric contact and shielding are disclosed in U.S. Pat. Nos. 5,539,149, 5,952,608 and German Patent Document 196 44 417.

SUMMARY OF THE INVENTION

It is an objection of the invention to provide devices for constructing well shielded openings for expansion boards sad similar objects in housings or boxes for electronic devices and instruments such as computers and particularly personal computers.

It is another object of the invention to provide a method for providing well shielded openings for expansion boards and so objects in housings or boxes for electronic devices.

Generally thus, a housing for electronic devices is provided, typically a computer box or box for other electronic circuits and particularly for such electronic circuits that are sensitive to external magnetic radiation, in particular high frequency electromagnetic radiation such as high frequency radio waves and microwaves. The housing is made from electrically conducting material, typically steel plate, ad has an opening generally intended for expansion boards, for example for boards that are intended or communication of the electronic circuits with the exterior such as other remotely, located electronic circuits. A frame is mounted at the opening and has outer portions connecting to the edges of the opening. Back plates, also called shielding, protection or covering plates, that can be comprised in such boards or be dummy boards or possibly only carry connectors connected through electrical lines to the electronic circuits inside the housing, are intended to be mounted in the opening. The back plates all have substantially the same shape including two large, approximately rectangular, identical opposite surfaces that can be elongated or strip shaped, a large inner surface and a large outer surface, and narrow longitudinal edge surfaces that at edge lines connect to the large surfaces, at two opposite edges of the large surfaces.

The frame is divided in structural elements, a left side frame part and a right side frame part and in most cases at least one intermediate part. Thereby, the frame can be adapted to an arbitrary number of back plates and even only one back plate. The frame parts are designed in a supplementary way in order to form, when all the back plates are mounted in the opening for which the opening is intended, together with the back plates a whole, continuous surfaces having no holes. In the case where the opening is intended for a least two back plates also at least one intermediate frame part is provided. The intermediate frame parts divide the opening in part openings so that each part opening is intended for one back plate. Such an intermediate part is then advantageously designed to cover the region between back plates that are placed at the sides of each other at the intermediate frame part and cover the part openings located on both sides of the intermediate frame part. Therefor, the intermediate frame part can have a main portion or upright extending between opposite edges of the opening and continuing at its ends into outer frame portions that connect to the edges of the opening and can cover an edge portion or margin of the housing at the opening.

Furthermore, contact or connection means are provided for mutually electrically connect back plates located at the sides of each other at an intermediate frame portion, and/or for electrically connecting a frame part to that back plate or those back plates that is/are located directly at the frame part. The connection means can include an elastic contact element mounted to or in the respective frame part, for example in a recess or a slot in an inner surface of the frame part that is directed towards the interior of the housing.

To connect the frame parts to the housing contact springs can be provided that for example are mounted to outer edge portions or flange portions of frame parts and that elastically press both against the portions at which they are mounted and against edge portions of the housing at the opening. Such a contact spring can enclose an edge portion or margin of a frame part so that it with two oppositely located legs or flaps elastically presses against opposite sides of the edge portion. On one of the legs or flaps a side flap is provided extending away from the edge portion where the spring is mounted and thereby comes in elastic contact with a surface of the housing.

Thus, the contact element is generally intended for electric connection between a back plate and a housing for electronic apparatus, the housing possibly including the frame parts mentioned above in addition to the very housing. The contact element can advantageously act with its elastic force substantially in a direction parallel to the plane of the back plate, i.e. against one of the narrow edge surfaces of the back plate and preferably against one of the edge lines at which the edge surface continues into a large surface of the back plate. The contact element can have a main portion and at least one elastic first projection extending from the main portion or connected to the main portion, the projection being the part of the contact element that acts against the back plate and is engaged with the edge surface thereof, and the main portion can be connected to the housing, such as a frame part included therein, in particular by being mounted in a recess or slot of the housing or the frame part.

The main portion can have the shape of a substantially flat strip having a uniform width and then the first projections extend from a first longitudinal edge of the main portion. The first projections are advantageously bent alternatingly to different sides of the main portion so that they simultaneously come, when the contact element is mounted between two back plates, in contact with these two back plates. Elastic, second projections can extend from a second, opposite longitudinal edge of the main portion and they can, like the first projections, be bent is alternatingly to different sides of the main portion, so that they come, when the contact element is mounted in a recess or a slot, in contact with opposite side walls of the recess or slot and thereby anchor the contact element and give it electric contact with the material in which the recess or slot is made. Each of the second projections can be located opposite one of the first projections so that the second and first projections located opposite each other are bent to different sides of the main portion, i.e. so that they are located on different sides of the main portion. The first projections can have the shape of a curved surface, be designed to have a ridge or have an outermost, most protruding portion or be bent or designed in any other way so that they at only one point come in contact with an edge surface of a back plate.

The above mentioned contact spring can generally be used for electrical connection between a flange and a surface extending parallel thereto. It can in particular comprise a substantially flat main flap and a projection located at the main flange which are designed so that between the main flap and the projection an interspace is provided having a thickness corresponding to or being somewhat smaller than the thickness of the flange for which the contact spring is intended, and so that the main flap and the projection can move elastically in relation to each other. The projection can comprise a substantially flat main portion, a first lateral flap protruding therefrom that is bent away from the main flap for contact with the surface located in parallel. The projection can also include a second lateral flap bent to the opposite direction, i.e. in a direction towards the main flap for contact with the flange. The lateral flaps can have such a shape, for example have a curved, convex profile, be curved or bent so that they come in a substantially point-shaped contact with the surface at which they are intended to be mounted. Furthermore, they can be connected to the main portion of the projection at regions located at opposite edges of the main portion.

For an improved mechanical and particularly electric contact the main flap can include an interior contact tongue completely surrounded by material of the main flap and bent in a direction towards the projection, i.e. in a direction towards the flange around which the spring is intended to be mounted. A plurality of contact springs can be joined by a web portion to form a contact strip. The web portion can be strip-shaped having a uniform width that is relatively small in relation to the length of the main flaps and the projections. The web portion can comprise a part with which a main flap and an opposite projection are joined.

A method of shielding an opening for insertable boards in a housing for electronic devices against electromagnetic radiation can according to the description above generally comprise the steps of:

Mounting in the opening frame parts that have outer portions at their tops and at their bottoms and, for the outermost frame parts located at the sides of the opening, the side frame parts, also outer portions at their left or right side. These outer portions connect to the edge of the opening. Furthermore, the frame parts also connect to each other at the outer portions. The frame parts can divide the opening in part openings intended for back plates.

Electrically connecting the frame parts to the housing and frame parts located at the sides of each other to each other. It can be achieved using the connection means and contact springs described above.

Inserting back plates that can be simple, can belong to insertable boards or only carry connectors, using simple insertion movements in the opening. A back plate is inserted in a separate one of the part openings formed. Each back plate is mounted at a separate frame part. After all back plates have been inserted, they totally cover, together with the fine parts, the opening.

Electrically connecting, achieved by the insertion movements, the back plates to the frame parts. Thereby, by the corresponding insertion movements, also inserted back plates located at the sides of each other can at the same time be electrically connected to each other.

Using the various devices described above and using the method described in short above a good and reliable shielding against electromagnetic radiation of a box for electronic circuits can be obtained. To provide a frame built from frame parts results in a good capability of adaptation for openings having different sizes. Furthermore, the frame parts give a possibility of providing shielding between the back plates mutually and between the back plates and the edge of the housing at the opening. Further, in particular for example the contact between back plates and frame parts becomes durable in time by the particularly chosen direction of the pressing force of the back plates. The frame parts can be provided to include one frame part for each back plate and they then give a possibility of a simple way of mounting a sign so that the function of an insertable board including its back plate or of another back plate can appear from the sign.

The electrical contacts or contact points between back plates and frame parts and the housing are arranged at a distance of each other, taken along each corresponding edge, that is chosen considering the wavelengths of the radiation against which the box should be shielded. This distance should always be smaller than the smallest one of these wavelengths.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 1 is an exploded perspective view of devices located at an opening for insertable boards in an apparatus housing, FIG. 4 is a sectional view along the line A—A in FIG. 3, FIG. 5 is a portion of the sectional view of FIG. 4 in a larger scale, FIG. 6 is a sectional view of a contact strip for contacting back plates, FIG. 7 is a perspective view of the strip according to FIG. 5, FIG. 8 is a sectional view of an alternative embodiment of a back plate contact strip, FIG. 9 is a perspective view of the strip according to FIG. 8, FIG. 10 is a view from the rear of devices mounted to each other at an opening for insertable boards in an apparatus housing using strips according to FIG. 8, FIG. 11 is a part view similar to FIG. 10 but in a larger scale, FIG. 12 is a perspective view of the devices according to FIG. 10 mounted to each other, FIG. 13 is a partial view similar to FIG. 12 but in a larger scale, FIG. 14 is a view from above of a contact spring, FIG. 15 is a sectional view of the spring according to FIG. 14, FIG. 16 is a view of the flattened material of the spring according to FIG. 14, FIG. 17 is a perspective view of a short embodiment of the contact spring of FIG. 14, FIG. 18 is a front view of the short spring according to FIG. 17, FIG. 19 is a side view of the short spring according to FIG. 17, FIG. 20 is a sectional view of the short spring according to FIG. 17 mounted between two frame parts, FIG. 23 is a rear view illustrating how the elastic strip according to FIGS. 21 and 23 is mounted to the frame part.

DESCRIPTION OF PREFERRED EMBODIMENTS

In FIG. 1 a perspective view is shown of those parts of an apparatus casing or apparatus box intended to accommodate electronic components which are required for availability from the exterior of insertable or expansion boards connected to connectors inside the box. For an apparatus casing for for example a computer, i.e. for a computer box, such availability from the exterior is required for a multitude of types of insertable boards such as graphic boards, audio boards, network boards. These boards include connectors for exterior connection which can be mounted in a back plate or shielding plate of the board or be available through an opening in the back plate.

Figure 3:
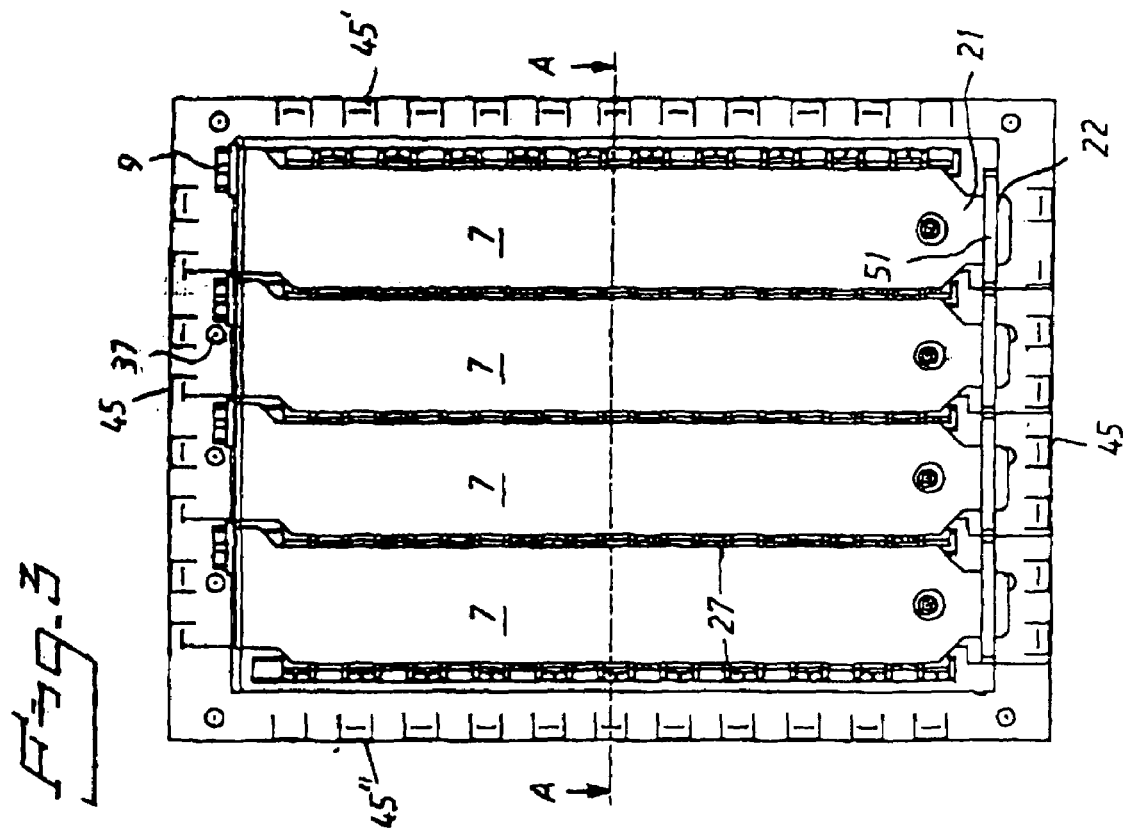
FIG. 3 is a view from the rear of the devices according to FIG. 2 mounted to each other.

In the sheet metal housing 1 of the apparatus box which is thus made from electrically conducting material a large rectangular opening 3 is provided, located usually at the back side of the box. In the opening 3 a plurality of frame parts 5 are attached. Each frame part 5, 5' except that one which is located outermost at one of the sides, in the figure the right frame part 5", gives an opening which in the case that no insertable board is inserted is covered with a dummy back plate 7 and which otherwise in the case where an insertable board is inserted inside the frame part 5, is covered with a similar back plate attached to the insertable board The back plates 7 can be designed according to a standard. They are mounted at the inner side of the respective frame part 5 and are attached thereto by screws 9 passing through slots in upper, bent portions 13 of the otherwise substantially flat back plates 7. The back plates 7 are made from strip-shaped material and have a uniform width but their lower ends are narrower forming bottom tongues 21 intended to be inserted in slots 22 at the rear end bottom of the frame parts 5 for fixing the lower portions of the back plates, see FIG. 3.

An intermediate frame part 5 comprises a relatively narrow main portion or upright 23 that extends vertically and at its back side, facing or engaged with edges of the main portions of back plates 7 located at the sides of each other, has a longitudinal groove 25, see FIGS. 5 and 4, for mounting electrically conducting, elastic contact elements designed as back plate contact strips 27. They have as will be described hereinafter, a plurality of contact tongues, the number of which can be adapted to the required contact points, considering for example the wavelengths against which the apparatus casing is intended to shield. Furthermore, the intermediate frame parts 5 have upper and lower portions 29, 31 extending from the interior of the box up to the opening 3. The upper and lower portions 29, 31 include vertical tongues 33, 35 extending upwards and downwards respectively and having holes 37, 39 in which screws can engage for attaching the frame part to the plate housing 1. The outermost portions 41, 43 of the tongues 33, 35 are thinner than the interior portions and carry upper and lower side contact strips 45 or one or more contact springs 85, see FIG. 14.

The upper and lower portions 29, 31 also include horizontal portions 47, 49 extending from the narrow vertical main portions 23 to one side thereof, to the same direction where the side fame part 5" that does not provide any opening is located. The horizontal portions 47, 49 have a substantially rectangular shape, where the connection to the vertical portions 23 is located at a corner of the rectangular shape. The horizontal portion 47 of the upper portion 29 has a hole for cooperation with the screw 9 for securing a back plate 7. The horizontal portion 49 of the lower portion 31 is prolonged somewhat backwards, towards the interior of the box, forming a projection 51, see FIG. 5, in which the slot 22 for fixing the lower edge of the back plate 7 is made. This horizontal portion 49 also carries at its rear edge located at the center of the box a vertically extending rectangular tongue 53 located in parallel to the backside of the box and to the corresponding back plate 7. This tongue 53 is visible from the outside of the box, also in the case where a back plate 7 is mounted in the Same part 5 and it has a groove or hole 55. The groove or hole 55 can be used for attaching signs or labels 57 to the tongues 53 by a suitable cooperating sapping device or possibly a screw.

The horizontal portions 47, 49 carry at there rear edges located at a distance of the center of the box 3 the upwards and downwards extending tongues 33, 35 respectively for attachment to the apparatus casing 1. A thin edge can be provided at the horizontal portions 47, 49 at the side of the place from which these tongues 33, 35 extend, and the widths of this edge can correspond to or preferably somewhat exceed the thickness of the material of the housing 1. The vertical main portion 23 can further have a gradual continuation to the horizontal portions of the upper and lower portions by vertical continuation portions 59, 61 which in the embodiment shown have the shapes of rectangular triangles with one small side connecting to an edge of the corresponding horizontal portion and with another small side connecting to the backwards directed side of main portion 23.

The side frame part 5' that gives an opening for a back plate 7, the left frame part in FIG. 1, is substantially designed as the intermediate frame parts 5 except the fact that the vertical main part 23' thereof carries a vertical thin side plate 63 extending up to the outer side of the frame part and the back side of the box, and the fact that the thin side plate 63 carries a flange part 65 that is located in the same plane as the upwards and downwards directed, respectively, tongues 33', 35' of the upper and lower portions 29', 31' of the frame part and extends away from the opening for the associated back plate 7. The side frame part 5' thereby obtains a continuous 51 flange along its upper, left and lower sides and also a continuous narrow edge extending backwards. The flange portion 65 caries a side contact strip 45' similar to the side contact strip 45 but having an adapted length or alternatively one or more separate contact springs 85, see FIG. 14.

The other side frame part 5", the right frame part in FIG. 1, has a vertical main portion 23" like the intermediate frame parts 5 that smoothly, for example such as is shown through triangular portions, connect to the upper and lower portions. A thin side plate 63" extends as for the other side frame part 5' to the backside of the box and likewise carries a flange portion. The upper and lower portions are here constituted of substantially the uppermost and lowermost portions respectively of the triangular shaped portions (59, 61) and they carry tongues that are directed upwards and downwards respectively so that a connected flange is obtained directed away from the openings for the back plates 7. The flange portion also carries a side contact strip 45" designed as the side contact strip 45' or one or more contact springs 85, see. FIG. 14.

Pins 67 cooperate with blind holes 69 in the upper and lower portions of the frame parts 5, 5', 5" in order to give the frame parts accurately defined positions in relation to each other and to give them a good electric connection with each other.

Figure 2:
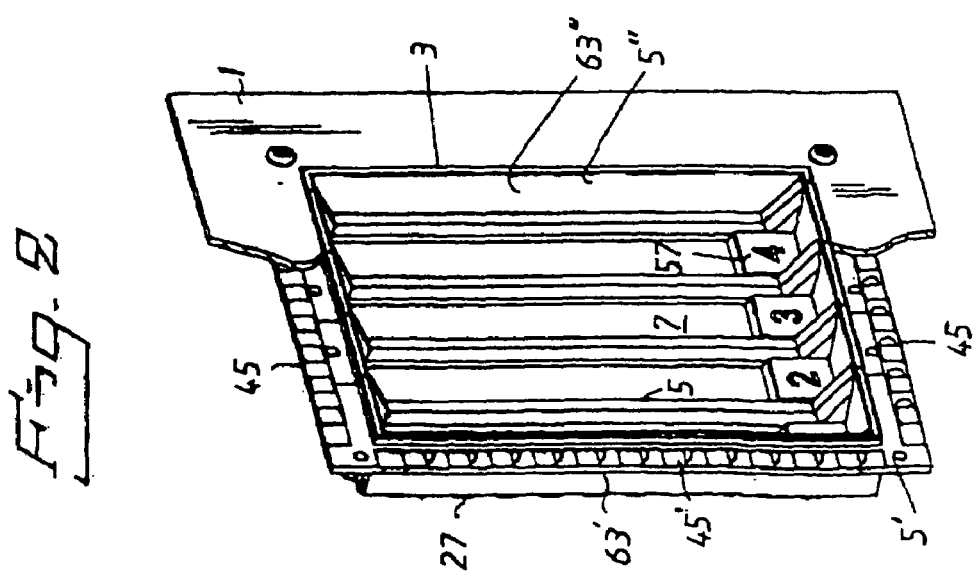
FIG. 2 is a perspective view of devices according to FIG. 1 mounted to each other.

In FIG. 2 frame parts are illustrated mounted to each other for an opening in the housing 1 that is intended for four insertable boards and hence for four back plates 7. Three intermediate frame parts 5 and one left side frame part 5' and one right side frame part 5" are required. The upper and lower side contact strips 45 have such a length that they extend along the upper and lower tongues of the frame parts when they are mounted to each other. The same frame parts are shown as seen from the interior of the box in FIG. 3 whereas cross sectional views are illustrated in FIGS. 4 and 5. In the latter figures is visible how the back plate contact strips 27 are mounted in the grooves 25 in the vertical main portions 23, 23', 23" of the frame parts 5, 5', 5". By the fact that the grooves 25 are located centrally between the back plates 7 and by the special design of the back plate contact strips 27, the back plate contact strips are well attached in the grooves and thereby obtain a good electric contact with the material of the main portions 23, 23', 23" of the frame parts and furthermore portions or more particularly tongues of the back plate contact strips elastically press against edges of back plates 7 that are located at the sides of each other, this giving a good electrical connection between the back plates mutually and between the back plates and the frame parts. The elastic force from the portions of the back plate contact strips 27 against the back plates have substantially directions parallel to the large surfaces of the main portions 19 of the back plates, i.e. they pass in the plane of these main portions. This is advantageous since the back plates cannot themselves move elastically in this direction and hence appear as totally stiff in relation to the back plate contact strips 27.

A cross sectional view and a perspective view of an embodiment of a back plate contact strip 27 in a non-tensioned state is shown in FIGS. 6 and 7 respectively. The back plate contact strips 27 are like the side contact strips 45, 45', 45" made from a strip of elastic, electrically conducting material. Suitable portions of the strip have been removed by punching and then or in connection with the punching the remaining part has been bent. Thus, a back plate contact strip 27 in this embodiment comprises a substantially whole, flat strip shaped main portion or web portion 71 from the two opposite edges of which tongues or flaps extend that are bent alternatingly to opposite sides. The flaps 73 that are intended for contacting the edge surfaces of the back plates extend from the inner edge of the main portion 71 and have a rectangular shape and a length corresponding to approximately the width of the main portion. They can have a weak bending along their center lines extending perpendicularly to the longitudinal axis of the main portion in order to facilitate insertion of the back plate contact strip and to give a good point contact with edge surfaces of the back plates 7. The flaps 73 are further, at their connection to the main portion 71, bent so that they form a relatively small angle of about 15–30° to the main portion.

Rectangular, shorter tongues or flaps 75 extend from the opposite, exterior edge of the main portion 71 and have substantially the same width as that of the inner flaps 75 but are shorter and have a length which for example can correspond to approximately half the width of the main portion 71. Each exterior flap 75 is located opposite an inner flap 73 that is bent to the opposite direction. The outer flaps 75 are at their connection to the main portion 71 bent so that they form a relatively large angle to the main portion, say about 60–80°, and press with their outer free edge, when the back plate contact strip is mounted, against the opposite side walls in the groove 25 and thereby keep the contact strip in place.

In the longitudinal direction of the back plate contact strip 27, as taken from an end of the strip, thus for example first an inner flap 73 is bent to the left, an outer flap 75 located opposite this inner flap is bent to the opposite direction, i.e. to the right, thereafter an inner flap 73 is bent to the right, the opposite outer flap 75 is bent to the left, the next inner flap 73 is bent to the left, etc.

When the back plate contact strips 27 have been mounted in the grooves 25 the outer flaps 75 are totally inserted in the grooves, see FIG. 5. The outer edge surface of the main portion 71 is engaged with the bottom of the grooves and the outer flaps elastically press against the side walls of the grooves and can even somewhat penetrate therein if the material of the frame parts is relatively soft. More than half the width of the main portion 71 is located outside the grooves whereas the outermost portions of the inner flaps 73 are located inside the grooves and are engaged with the side walls thereof as long as no back plate 7 is mounted. Due to the bending of the inner flaps 73 in their longitudinal direction they are with point contacts engaged with the side walls. When a back plate 7 is mounted, either as a dummy back plate or as a back plate on an accessory board, the edge surfaces of the back plate come in contact with the inner flaps 73, at points at the center lines thereof along which the longitudinal bendings are made, at positions quite at the inner surface of the frame parts. Then, the inner flaps 73 are bent in the direction towards the main portion 71 and their engagement with the side wall of the grooves will cease. The elastic force from the inner flaps then passes substantially in the same plane as the main portions 19 of the back plates 7, with a pointwise contact between the center Line of the flaps or the ridges thereof and the outer edge line of the main portions 19, i.e. the edge line forming the connection between the outer or rear surface of the main portions 19 and the narrow edge surfaces of the main portions. It gives a very secure mechanical and thereby electrical contacting between back plate contact strips and back plates.

The back plate contact strips 27 are mounted in the grooves 25 using a tool, not shown, so that the outer flaps 75 are pressed down into the grooves and act as barbs and thereby keep the contact strips in the grooves. At the same time, using the tool, the contact flaps 73 are bent inwards towards the web of the contact strips so far that they become located inside the walls of the groove 27. The contact flaps 73 move elastically towards the walls of the groove 25 after releasing the tool.

An alternative embodiment 27' of the back plate contact strips appears from the cross sectional view of FIG. 8 and the perspective view of FIG. 9. The main portion 71' has as in the first embodiment a flat configuration of substantially a strip-shape, including only inner bent flaps 73', designed and bent in the same ways as the flaps 73 in the first embodiment whereas at the opposite outer edge, relatively short tongues 76 extend, these tongues thus located in the same plane as the main portion. In the longitudinal direction of the back plate contact strip 27', taken from an end of the strip, thus for example first an inner flap 73' is bent to the right, thereafter there is an inner flap 73' that is bent to the left, thereafter there is a tongue 76, thereafter, again an inner flap 73' is bent to the right, etc. This embodiment is not adapted to be used together with grooves 25 having a uniform width as above. Instead of the grooves 25, when using these contact strips, the frame parts 5, 5', 5" are provided with a row of recesses, see the views from the interior in FIGS. 10 and 11 and the perspective views of FIGS. 12 and 13. Wider recesses 77 are thus provided for the inner bent flaps 73' and narrower recesses 78 for the tongues 76 which, using an adapted tool, not shown, are pressed into then, so that the edges of the tongues is cut into the end surfaces of the recesses 78, whereby a good mechanical attachment and a good electrical contacting is obtained. In front of the wider recesses 77 shorter recesses 79 are provided so that at the connection between two inner flaps 73' short projections 80 extending laterally are obtained that are engaged with the web portion 71'. The contact between the inner flaps 73' and the back plates 7 is obtained in the same way as for the first embodiment. The tongues 76 additionally keep, when they are inserted in the recesses 78, the web portion 71' in a straight state.

The design of the side contact strips 45, 45' appears from FIGS. 14–16. They are intended to secure the electrical connection between the frame parts 5, 5', 5" and the sheet metal housing 1. They comprise rectangular flaps 81 that at their one long side continue into a relatively narrow strip-shaped portion 83 that is bent to be located in a nearly perpendicular but somewhat acute angle in relation to the main portion 81, i.e. in an angle somewhat smaller than 90°. The narrow portion 83 has a height somewhat exceeding the thickness of the tongues or flanges on which the side contact strip 45, 45' is to be mounted, and form the web or main portion of the side contact strips. From the other edge of the narrow portion 83 projections 85 extend having main portions 87 which are bent to be located substantially perpendicularly to the narrow portion and thereby almost in parallel to the opposite rectangular flaps 81 but however in a relatively small angle in relation to it so that the free edge of the main portion 87 of the projection 85 is located at a distance from the opposite rectangular flap 81 that is somewhat smaller than the thickness of the material on which the contact strip is to be mounted.

The projections 85 can have a length, taken from the connection to the narrower web portion 83, that substantially corresponds to the length of the short sides of the rectangular flaps 81, i.e. the projections 85 and the flaps 81 extend approximately equally far from the narrow web portion 83. The projections 85 have a rectangular main portion or center portion 87 from which laps 89, 89' extend laterally, in the longitudinal direction of the contact strip in parallel to the longitudinal direction of the web portion 83. These flaps 89, 89' can have a rounded shape and for example correspond to half an oval, ellipse or circle and connect to the major portion of the short sides of the rectangular shape. They are somewhat bent in relation to the center portion 87 so that the flap 89' at one of the edges of the center portion is bent upwards, away from the main portion of side contact strip 45, 45', whereas the flap 89 at the opposite edge of the center portion is bent downwards, towards the rectangular flap 81.

Projections 85 and rectangular flaps 81 are thus located opposite each other. In each flap 81 a U-shaped punch-out can have been made so that small tongues 91 are obtained that are bent in the direction towards the projections 85, towards the interior of the contact strips. Furthermore, a strip-shaped portion 93 at the free edge of each rectangular flap 81 can be weakly bent outwards from the interior of the contact strip, away from the projection 85, to facilitate mounting the contact strip 45, 45' on or around the flange or edge portion where it is to be used.

After the contact strip has been mounted on a frame part 5, 5', 5" the small tongues 91 that extend from a place in the rectangular flaps 81 are in mechanical contact with for example the outer side of the flange, see also FIG. 20, and gives a mechanical anchoring thereto. Furthermore, that one of the rounded flaps 89 that extends from a projection 85 and is bent in the direction towards the interior of the contact strip, is in mechanical contact with a flange and gives an electric connection with it. The other flap 89' stands out from the contact strip and gives a mechanical contact with the plate housing 1 and thereby an electrical connection therewith is produced. Thus, due to the contact strip 45, 45' a good electrical connection between flanges of the frame parts and the apparatus housing is obtained.

Instead of side contact strips 45, 45' held together by the narrow web portions 83 individual contact elements 45" can be used, see the perspective view of FIG. 17 and also FIGS. 18–20. They arc made as short segments of the side contact strips and comprise one projection 85', one rectangular flap 81' and a narrow portion 83' having the same lengths as the width of the rectangular main portion 87 of the projection 85.

The function of an individual contact spring 45" is illustrated by FIG. 20 that also illustrates the function of a corresponding continuous contact strip 45, 45'. The contact spring is attached to the flange of a frame part 5, 5', 5", for example as is illustrated on a somewhat recessed portion of the flange. Then the tongue 91 is in mechanical contact with the outer side of the flange and gives a mechanical anchoring thereto. Furthermore, one of the round side flaps 89 on the projection 85 comes in a mechanical contact, which is almost, because of the profile of the side flap, of the point type, approximately at its point or outermost part 95 with the inner side of the flange and gives an electrical connection with it. The other rounded side flap 89' that stands out from the main portion 87 of the projections gives thereby a mechanical contact, also here almost a point-shaped contact approximately at its outermost part 95' with the portion of the sheet metal housing 1 that is located at the flange and thereby an electrical connection with it is produced.

Figure 21:
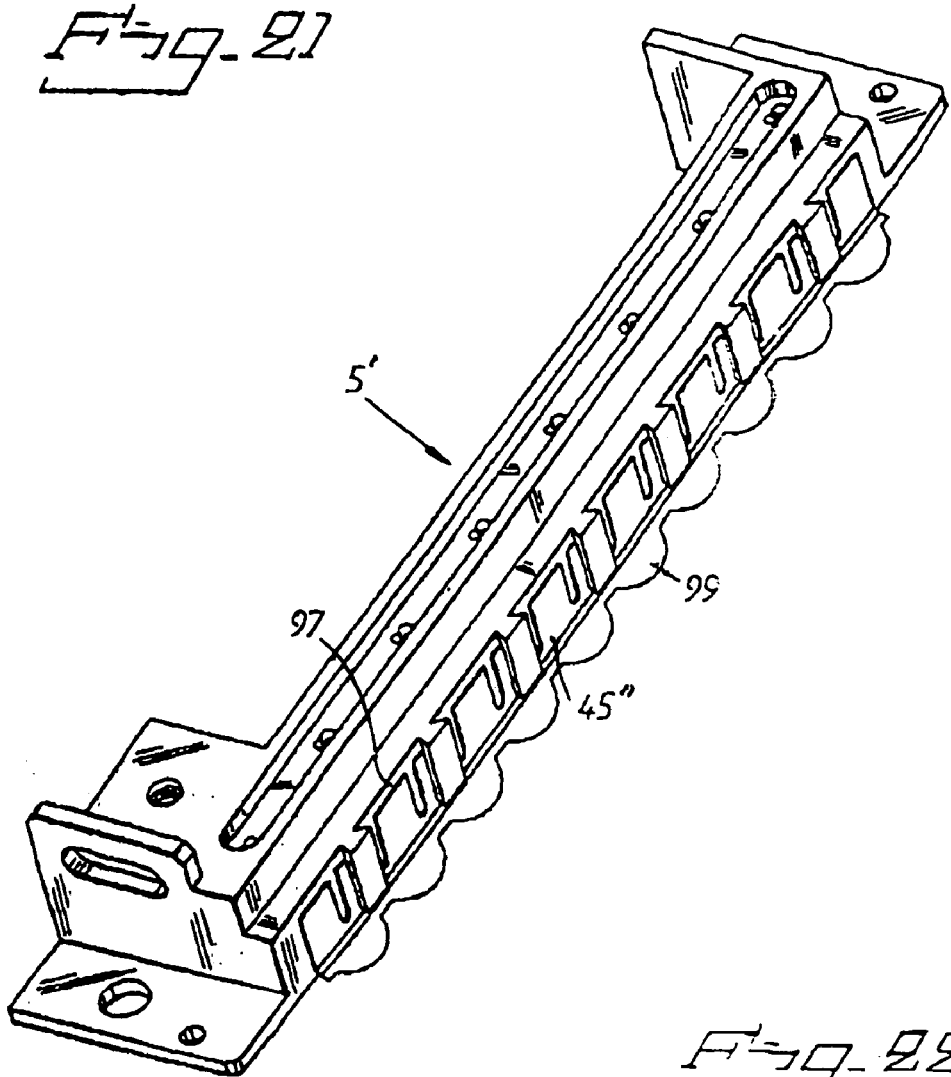
FIG. 21 is a perspective view of a side frame part in an alternative embodiment of an elastic strip for contact between a long edge of the frame part and the edge of an opening in an apparatus housing.
Figure 22:
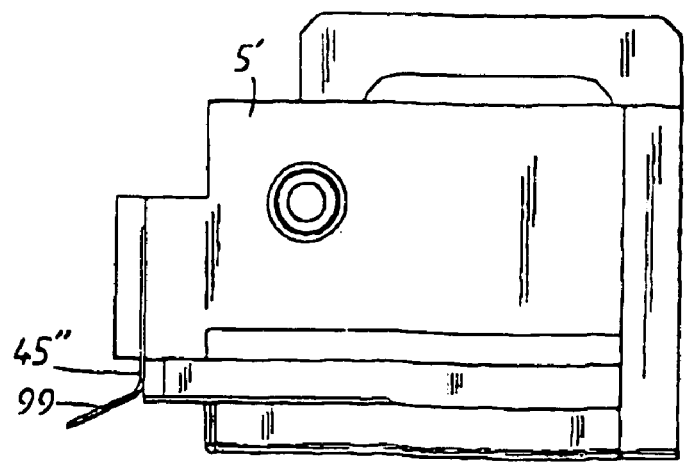
FIG. 22 is a view from above of the frame part including a mounted elastic strip according to FIG. 21.

An alternative contacting between side frame parts and apparatus housing is illustrated in FIGS. 21, 22 and 23. The side frame parts have in this case no outer thin flanges, at least not at the vertical, long outer sides. Instead, on the outer sides a plurality of recesses 97 are provided, having obliquely extending, inwards sloping side walls forming spaces resembling dovetails. Modified elastic contact strips 45" engage at their rear or inner regions with the material standing out between the recesses 97 and have at their front regions rounded flaps 99 which are bent to be located in an obtuse angle in relation to the rear regions, for example in an angle of between 100 and 135°. When the side frame part is mounted in its place in an apparatus housing, the flaps 99 come in mechanical and electric contact with the inner side of the margin or edge region of the housing at the openings 3. At the upper and lower edges of the side frame parts flanges are provided such as been described above having contacting through elastic strips 45.

The different elastic contact strips and contact elements of elastic plate material that have been described above can in some cases advantageously be replaced by elastic elements, not shown, made from a body of a material having some or a considerable elasticity, for example from an elastomer or a rubber material. The elastic body is coated with a surface layer of electrically conducting material such as a suitable metal which can have been attached using for example sputtering. Back plate contact strips made in this way can for example have a cross section having an outer profile approximately agreeing with the outer profile of the back plate contact strips 27, 27', see FIGS. 6 and 8, having oblique large surfaces for contact with back plates and can be attached by an adhesive in suitable grooves or recesses, compare the recesses 25 in FIG. 5. Back plate contact strips can thus have contact surfaces to the back plates that are located in a relatively small angle in relation to each other, i.e. in the range of 5–30°. However, the contact surfaces can also be substantially parallel. The advantage of elastic strips of this kind is that an electrical contacting can be obtained along the whole length of the strips which can improve the shielding against high frequency electromagnetic fields.

While specific embodiments of the invention have been illustrated and described herein, it is realized that numerous additional advantages, modifications and changes will readily occur to those skilled in the art Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

The invention claimed is:

1. A contact element for providing an electrical connection between a back plate for insertable boards and an apparatus housing and/or a second back plate for insertable boards located at a side of the back plate, the back plate and the second back plate being located in parallel to each other and arranged in the apparatus housing, the back plate and the second back plate each having opposite large surfaces and narrow edge surfaces connecting the large surfaces, the contact element comprising:
   a main portion secured in a recess in the apparatus housing, the recess located at a side of an opening for the back plate in the apparatus housing; and
   at least one elastic first projection projecting from the main portion and acting with an elastic force along a line intersecting the main portion said line being substantially parallel to a plane in which the back plate is located, when the back plate is inserted in the opening and the main portion is secured in the recess, such that the at least one elastic first projection contacts the back plate only at an one of the narrow edge surfaces thereof.

2. The contact element of claim 1, wherein said at least one elastic first projection is, at its connection to the main portion, bent back towards the main portion to form an acute angle in the range of 15°–30° to a part of the main portion located at said connection.

3. The contact element of claim 1, wherein said at least one elastic first projection is substantially flat.

4. The contact element of claim 1, wherein said at least one elastic first projection has a weak bending along its center line extending from the main portion to provide good point contact with the edge surface of the back plate, when the back plate is inserted in the opening and the main portion is secured in the recess.

5. The contact element of claim 1, wherein the main portion has a width making a portion thereof always located outside the recess when the main portion is secured in the recess.

6. The contact element of claim 1, wherein the main portion has a shape of a substantially flat strip, and wherein the contact element includes a plurality of elastic first projections projecting from a first longitudinal edge of the main portion, the plurality of elastic first projections being bent alternately to opposite sides of the main portion.

7. The contact element of claim 6, wherein the first longitudinal edge of the main portion is opposite a second longitudinal edge, the second longitudinal edge being located in the recess when the main portion is secured in the recess.

8. The contact element of claim 6, further including elastic second projections projecting from a second, opposite longitudinal edge of the main portion, the second projections being bent alternately to different sides of the main portion for contacting sidewalls of the recess when the main portion is introduced into the recess, thereby securing the main portion in the recess.

9. The contact element of claim 8, wherein the elastic second projections are flat.

10. The contact element of claim 8, wherein the elastic second projections are located opposite the first projections and are bent to different sides of the main portion in relation to the first projections.

11. The contact element of claim 1, further including at least one second projection projecting from the main portion for cutting into an end surface of the recess when the main portion is introduced into the recess, thereby securing the main portion in the recess.

12. The contact element of claim 1, wherein the main portion has the shape of a substantially flat strip, said at least one elastic first projection including a plurality of first projections projecting from a first longitudinal edge of the main portion, the main portion including, at a second, opposite longitudinal edge, second projections located in the plane of the main portion, the second projections being the only parts of the main portion introduced into the recess when the main portion is secured in the recess.

13. A contact element for providing an electrical connection between a back plate for insertable boards and an apparatus housing and/or a second back plate for insertable boards located at a side of the back plate, the back plate and the second back plate being located in parallel to each other and arranged in the apparatus housing, the back plate and the second back plate each having opposite large surfaces and narrow edge surfaces connecting the large surfaces, the contact element comprising:
 a main portion secured in a recess in the apparatus housing, the recess located at a side of an opening for the back plate in the apparatus housing; and
 at least one elastic first projection projecting from the main portion and acting with an elastic force along a line intersecting the main portion, said line being substantially parallel to a plane in which the back plate is located, when the back plate is inserted in the opening and the main portion is secured in the recess, such that the at least one elastic first projection contacts the back plate only at one of the narrow edge surfaces thereof, the at least one elastic first projection being bent or displaced towards the main portion when the back plate is inserted into the opening.

14. The contact element of claim 13, wherein the at least one elastic first projection has a free edge located opposite a connection of the at least one elastic first projection to the main portion, the free edge being displaced to be located closer to a part of the main portion located at said connection when the back plate is inserted in the opening.

15. The contact element of claim 13, wherein said at least one elastic first projection is, at its connection to the main portion, bent back towards the main portion to form an acute angle in the range of 15°–30° to a part of the main portion located at said connection.

16. The contact element of claim 13, wherein said at least one elastic first projection is substantially flat.

17. The contact element of claim 13, wherein said at least one elastic first projection has a weak bending along its center line extending from the main portion to provide good point contact with the edge surface of the back plate, when the back plate is inserted in the opening and the main portion is secured in the recess.

18. The contact element of claim 13, wherein the main portion has a width making a portion thereof always located outside the recess when the main portion is secured in the recess.

19. The contact element of claim 13, wherein the main portion has a shape of a substantially flat strip, and wherein the contact element includes a plurality of elastic first projections projecting from a first longitudinal edge of the main portion, the plurality of elastic first projections being bent alternately to opposite sides of the main portion.

20. The contact element of claim 19, wherein the first longitudinal edge of the main portion is opposite a second longitudinal edge, the second longitudinal edge being located in the recess when the main portion is secured in the recess.

21. The contact element of claim 19, further including elastic second projections projecting from a second, opposite longitudinal edge of the main portion, the second projections being bent alternately to different sides of the main portion for contacting sidewalls of the recess when the main portion is introduced into the recess, thereby securing the main portion in the recess.

22. The contact element of claim 21, wherein the elastic second projections are flat.

23. The contact element of claim 21, wherein the elastic second projections are located opposite the first projections and are bent to different sides of the main portion in relation to the first projections.

24. The contact element of claim 13, further including at least one second projection projecting from the main portion for cutting into an end surface of the recess when the main portion is introduced into the recess, thereby securing the main portion in the recess.

25. The contact element of claim 13, wherein the main portion has the shape of a substantially flat strip, said at least one elastic first projection including a plurality of first projections projecting from a first longitudinal edge of the main portion, the main portion including, at a second, opposite longitudinal edge, second projections located in the plane of the main portion, the second projections being the only parts of the main portion introduced into the recess when the main portion is secured in the recess.

26. A contact element for providing an electrical connection between a back plate for insertable boards and an apparatus housing and/or a second back plate for insertable boards located at a side of the back plate, the back plate and the second back plate being located in parallel to each other and arranged in the apparatus housing, the back plate and the second back plate each having opposite large surfaces and narrow edge surfaces connecting the large surfaces, the contact element comprising:
- a main portion secured in a recess in the apparatus housing, the recess located at a side of an opening for the back plate in the apparatus housing; and
- at least one elastic first projection projecting from the main portion and acting with an elastic force along a line intersecting the main portion said line being substantially parallel to a plane in which the back plate is located, when the back plate is inserted in the opening and the main portion is secured in the recess, such that the at least one elastic first projection contacts the back plate only at one of the narrow edge surfaces thereof,
- the at least one elastic first projection contacting the back plate, when the back plate is inserted and has been inserted in the opening, only at positions of the at least one elastic first projection located between a free edge of the at least one elastic first projection and a connection of the at least one elastic first projection to the main portion of the contact element.

27. The contact element of claim 26, wherein said at least one elastic first projection is, at its connection to the main portion, bent back towards the main portion to form an acute angle in the range of 15°–30° to a part of the main portion located at said connection.

28. The contact element of claim 26, wherein said at least one elastic first projection is substantially flat.

29. The contact element of claim 26, wherein said at least one elastic first projection has a weak bending along its center line extending from the main portion to provide good point contact with the edge surface of the back plate, when the back plate is inserted in the opening and the main portion is secured in the recess.

30. The contact element of claim 26, wherein the main portion of the contact element has a width making a portion thereof always located outside the recess when the main portion is secured in the recess.

31. The contact element of claim 26, wherein the main portion of the contact element has a shape of a substantially flat strip, and wherein the contact element includes a plurality of elastic first projections projecting from a first longitudinal edge of the main portion, the plurality of elastic first projections being bent alternately to opposite sides of the main portion.

32. The contact element of claim 31, wherein the first longitudinal edge of the main portion is opposite a second longitudinal edge, the second longitudinal edge being located in the recess when the main portion is secured in the recess.

33. The contact element of claim 31, further including elastic second projections projecting from a second, opposite longitudinal edge of the main portion, the second projections being bent alternately to different sides of the main portion for contacting sidewalls of the recess when the main portion is introduced into the recess, thereby securing the main portion in the recess.

34. The contact element of claim 33, wherein the elastic second projections are flat.

35. The contact element of claim 33, wherein the elastic second projections are located opposite the first projections and are bent to different sides of the main portion in relation to the first projections.

36. The contact element of claim 26, further including at least one second projection projecting from the main portion for cutting into an end surface of the recess when the main portion of the contact element is introduced into the recess, thereby securing the main portion of the contact element in the recess.

37. The contact element of claim 26, wherein the main portion has the shape of a substantially flat strip, said at least one elastic first projection including a plurality of first projections projecting from a first longitudinal edge of the main portion, the main portion including, at a second, opposite longitudinal edge, second projections located in the plane of the main portion, the second projections being the only parts of the main portion introduced into the recess when the main portion is secured in the recess.

38. A contact element for providing an electrical connection between a back plate for insertable boards and an apparatus housing and/or a second back plate for insertable boards located at a side of the back plate, the back plate and the second back plate being located in parallel to each other and arranged in the apparatus housing, the back plate and the second back plate each having opposite large surfaces and narrow edge surfaces connecting the large surfaces, the contact element comprising:
- a main portion secured in a recess in the apparatus housing, the recess located at a side of an opening for the back plate in the apparatus housing; and
- at least one elastic first projection projecting from the main portion and acting with an elastic force along a line intersecting the main portion, said line being substantially parallel to a plane in which the back plate is located, when the back plate is inserted in the opening and the main portion is secured in the recess, such that the at least one elastic first projection contacts the back plate only at one of the narrow edge surfaces thereof,
- the at least one elastic first projection, at its connection to the main portion of the contact element, being bent to be always overlying a part of the main portion located at said connection when looking at the main portion in a direction perpendicular to one of the large surfaces of the main portion.

39. The contact element of claim 38, wherein said at least one elastic first projection is, at its connection to the main portion, bent back towards the main portion to form an acute angle to a part of the main portion located at said connection.

40. The contact element of claim 38, wherein said at least one elastic first projection is, at its connection to the main portion, bent back towards the main portion to form an acute angle in the range of 15°–30° to a part of the main portion of the contact element located at said connection.

41. The contact element of claim 38, wherein said at least one elastic first projection is substantially flat.

42. The contact element of claim 38, wherein said at least one elastic first projection has a weak bending along its center line extending from the main portion to provide good point contact with the edge surface of the back plate, when the back plate is inserted in the opening and the main portion is secured in the recess.

43. The contact element of claim 38, wherein the main portion has a width making a portion thereof always located outside the recess when the main portion is secured in the recess.

44. The contact element of claim 38, wherein the main portion has a shape of a substantially flat strip, and wherein the contact element includes a plurality of elastic first projections projecting from a first longitudinal edge of the main portion, the plurality of elastic first projections being bent alternately to opposite sides of the main portion.

45. The contact element of claim 44, wherein the first longitudinal edge of the main portion is opposite a second longitudinal edge, the second longitudinal edge being located in the recess when the main portion is secured in the recess.

46. The contact element of claim 44, further including elastic second projections projecting from a second, opposite longitudinal edge of the main portion, the second projections being bent alternately to different sides of the main portion for contacting sidewalls of the recess when the main portion is introduced into the recess, thereby securing the main portion in the recess.

47. The contact element of claim 46, wherein the elastic second projections are flat.

48. The contact element of claim 46, wherein the elastic second projections are located opposite the first projections and are bent to different sides of the main portion in relation to the first projections.

49. The contact element of claim 38, further including at least one second projection projecting from the main portion for cutting into an end surface of the recess when the main portion is introduced into the recess, thereby securing the main portion in the recess.

50. The contact element of claim 38, wherein the main portion has the shape of a substantially flat strip, the at least one elastic first projection including a plurality of first projections projecting from a first longitudinal edge of the main portion, the main portion including, at a second, opposite longitudinal edge, second projections located in the plane of the main portion, the second projections being the only parts of the main portion introduced into the recess when the main portion is secured in the recess.

* * * * *